US007375598B2

(12) United States Patent
Hung et al.

(10) Patent No.: US 7,375,598 B2
(45) Date of Patent: May 20, 2008

(54) SYSTEM AND METHOD FOR INCREASING RADIO FREQUENCY (RF)/MICROWAVE INDUCTOR-CAPACITOR (LC) OSCILLATOR FREQUENCY TUNING RANGE

(75) Inventors: Chih-Ming Hung, McKinney, TX (US); Dirk Leipold, Plano, TX (US); Nathen Barton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 11/009,495

(22) Filed: Dec. 10, 2004

(65) Prior Publication Data
US 2005/0184820 A1 Aug. 25, 2005

Related U.S. Application Data

(60) Provisional application No. 60/546,248, filed on Feb. 19, 2004.

(51) Int. Cl.
*H03B 5/00* (2006.01)
(52) U.S. Cl. .......................... 331/117 FE; 331/117 R; 331/167; 331/177 V; 331/16; 331/36 L
(58) Field of Classification Search .......... 331/117 FE, 331/117 R, 167, 177 V, 179, 16, 36 L
See application file for complete search history.

(56) References Cited

U.S. PATENT DOCUMENTS 4,785,345 A 11/1988 Rawls et al.

6,870,457 B2 * 3/2005 Chen et al. ................. 336/200
2003/0042571 A1 3/2003 Chen et al.
2004/0196110 A1 * 10/2004 Boccuzzi et al. ....... 331/177 V

OTHER PUBLICATIONS

Kral, A., et al., "RF-CMOS Oscillators with Switched Tuning," IEEE 1998 Custom Integrated Circuits Conference, 1998, pp. 555-558, IEEE, Los Alamitos, CA.
Väänänen, P., et al., "A 3.6 GHz Double Cross-Coupled Multivibrator VCO with 1.6-GHZ Tuning," IEEE Transactions on Circuits and Systems—II: Analog and Digital Signal Processing, Aug. 2001, pp. 799-802, vol. 48, No. 8, IEEE, Los Alamitos, CA.
Yim, S-M., et al., "Demonstration of a Switched Resonator Concept in a Dual-Band Monolithic CMOS LC-Tuned VCO," IEEE 2001 Custom Integrated Circuits Conference, 2001, pp. 205-208, IEEE, Los Alamitos, CA.

* cited by examiner

*Primary Examiner*—Arnold Kinkead
(74) *Attorney, Agent, or Firm*—Steven A. Shaw; W. James Brady; Frederick J. Telecky, Jr.

(57) ABSTRACT

System and method for increasing the frequency tuning range of a RF/microwave LC oscillator. A preferred embodiment comprises a voltage controlled oscillator (VCO) configured to generate an output signal at a frequency that is dependent upon a magnitude of an input voltage level and an effective inductance of an inductive load and a variable inductor coupled to the VCO. The variable inductor comprises a primary inductor coupled to the VCO to produce a magnetic field based upon a current flowing through the primary inductor and a secondary inductor magnetically coupled to the primary inductor, the secondary inductor to affect the magnitude of the effective inductance of the primary inductor.

12 Claims, 8 Drawing Sheets

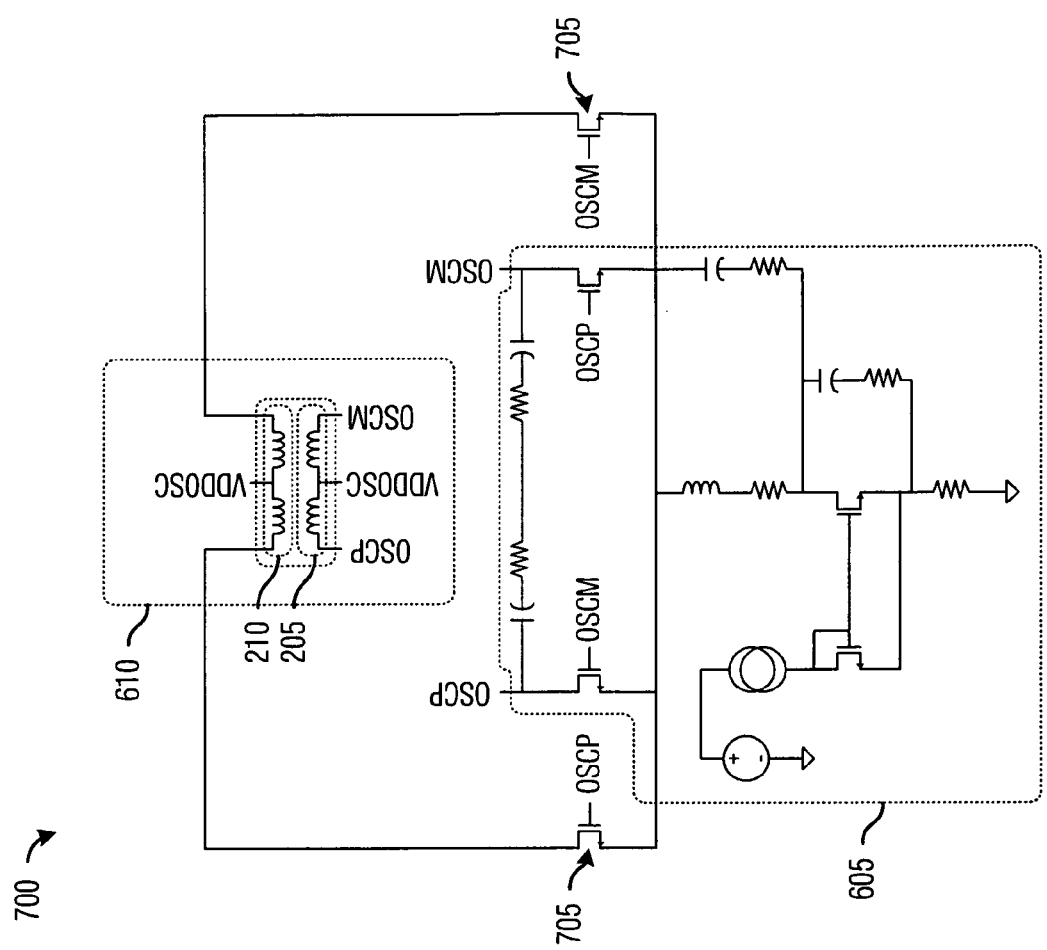
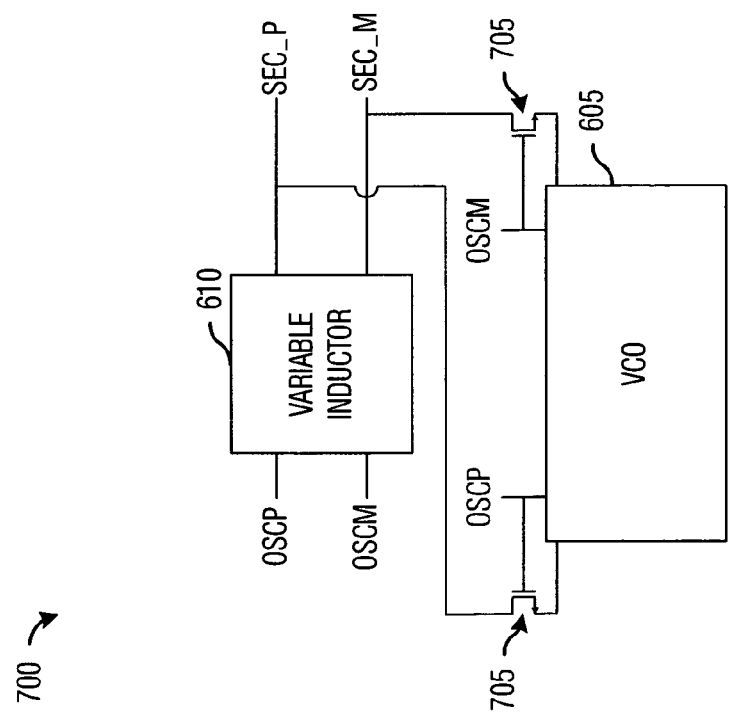
Fig. 7b
Fig. 7a

SYSTEM AND METHOD FOR INCREASING RADIO FREQUENCY (RF)/MICROWAVE INDUCTOR-CAPACITOR (LC) OSCILLATOR FREQUENCY TUNING RANGE

CROSS-REFERENCE TO RELATED APPLICATIONS

This application claims the benefit of U.S. Provisional Application No. 60/546,248, filed Feb. 19, 2004, entitled "A Novel and Economic Way to Increase an RF/Microwave LC Oscillator Frequency Tuning Range," which application is hereby incorporated herein by reference.

TECHNICAL FIELD

The present invention relates generally to a system and method for wireless communications, and more particularly to a system and method for increasing the frequency tuning range of a RF/microwave LC oscillator.

BACKGROUND

A desire of a cellular telephone user is to have a single cellular telephone that can operate anywhere in the world, a "world" phone. Unfortunately, in order to operate at different locations throughout the world, the world phone needs to be able to communicate with different cellular communications networks, each using a potentially different communications mechanism, as well as being able to tune its oscillator to different frequency ranges. This is due to the wide variety of communications standards being used in different nations. For example, in the United States, it is common to encounter GSM (Global System for Mobile Communications), CDMA (Code Division Multiple Access), and TDMA (Time-Division Multiple Access) cellular telephone networks. In addition to the three types of cellular telephone networks, there can be multiple commonly used frequency ranges, 850 and 900 MHz ranges as well as 1.8 and 1.9 GHz ranges. In other countries, other types of cellular telephone networks and frequency ranges may be in use.

One solution to the problem of being able to tune an oscillator to such a wide variety of frequency ranges is to have multiple oscillators, one for each frequency range of interest. With multiple oscillators, each oscillator can be optimized for each frequency range, potentially maximizing tuning accuracy.

Another solution to the problem is to use a single oscillator but with multiple oscillator cores or LC tanks. The multiple oscillator cores or LC tanks can be used to extend the tuning range of the single oscillator without needing multiple oscillators. Each of the multiple oscillator cores or LC tanks can be switched in when needed. Again, the use of multiple oscillator cores or LC tanks can allow the optimization for the different frequency ranges.

Yet another solution to the problem is to use a switch, such as a CMOS switch, to short circuit a portion of an inductor to increase the tuning range of the local oscillator. The use of the switch can permit the use of a single local oscillator.

One disadvantage of the prior art is that the use of multiple local oscillators and/or multiple oscillator cores or LC tanks is that the oscillators consume a considerable amount of silicon area. Therefore, it is desired to minimize the number of local oscillators or oscillator cores.

A second disadvantage of the prior art is that due to a high quality factor requirement for the inductor used in the oscillator, the power on resistance of the switch must be low. This places a requirement that the switch must be physically large, thereby requiring a large amount of silicon area to be dedicated to the switch and the oscillator. Furthermore, as the oscillator operating frequency increases, parasitic capacitance introduced by the large switch can become problematic due to the fact that the total capacitance of the oscillator core is small.

SUMMARY OF THE INVENTION

These and other problems are generally solved or circumvented, and technical advantages are generally achieved, by preferred embodiments of the present invention which provides a system and method for increasing the tuning frequency range of a RF/microwave LC oscillator.

In accordance with a preferred embodiment of the present invention, an integrated circuit comprising a first inductor formed on a first layer and a second inductor formed on a second layer and sharing a substantially similar footprint as the first inductor is provided. The first inductor to provide an effective inductive load to circuitry coupled to the first inductor. The second inductor comprises a transistor having a first terminal coupled to a first end of the second inductor and a second terminal coupled to a second end of the second inductor, the second inductor to affect the effective inductive load provided by the first inductor.

In accordance with another preferred embodiment of the present invention, an oscillator with extended frequency tuning range is provided. The oscillator comprises a voltage controlled oscillator (VCO), the VCO is configured to generate an output signal at a frequency that is dependent upon a magnitude of an input voltage signal and an effective inductance of an inductive load, and a variable inductor coupled to the VCO is provided. The variable inductor comprising a primary inductor coupled to the VCO, the primary inductor to produce a magnetic field based upon a current flowing through the primary inductor, resulting in an inductive load for the VCO, and a secondary inductor magnetically coupled to the primary inductor, the secondary inductor to affect the magnitude of the effective inductance of the primary inductor.

In accordance with another preferred embodiment of the present invention, a method for designing an oscillator with extended frequency tuning range is provided. The method comprises determining a number of inductance loops in the oscillator based upon the extended frequency tuning range, calculating a set of characteristics for each inductance loop, simulating the performance of the oscillator, and fabricating the oscillator if the oscillator meets performance expectations.

An advantage of a preferred embodiment of the present invention is that the frequency tuning range of a RF/microwave LC oscillator is increased without the use of multiple oscillator cores and LC tanks. Since multiple oscillator cores and LC tanks are not used, the LC oscillator can be kept to a minimum size, thereby decreasing the silicon footprint of the LC oscillator.

A further advantage of a preferred embodiment of the present invention is that only an insignificant parasitic capacitance is added to the LC oscillator. Therefore, as the operating frequencies increase, the parasitic capacitance does not have an adverse affect on the LC oscillator.

Yet another advantage of a preferred embodiment of the present invention is that multiple inductors can be added to the LC oscillator to provide a wide frequency tuning range. For example, more than one inductor can be added to the LC oscillator and these added inductors can be switched in and out, either individually or in combination, to provide a wide frequency tuning range with potentially fine tuning adjustments.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7a and 7b are diagrams of a circuit comprising a VCO and a variable inductor, wherein the variable inductor and active components coupled to the variable inductor can help to further increase the tuning range of the VCO, according to a preferred embodiment of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a multi-standard cellular telephone that needs to operate in multiple frequency ranges. The invention may also be applied, however, to other electronic devices, such as communications devices, that have a need to operate in multiple frequency ranges.

Figure 1:
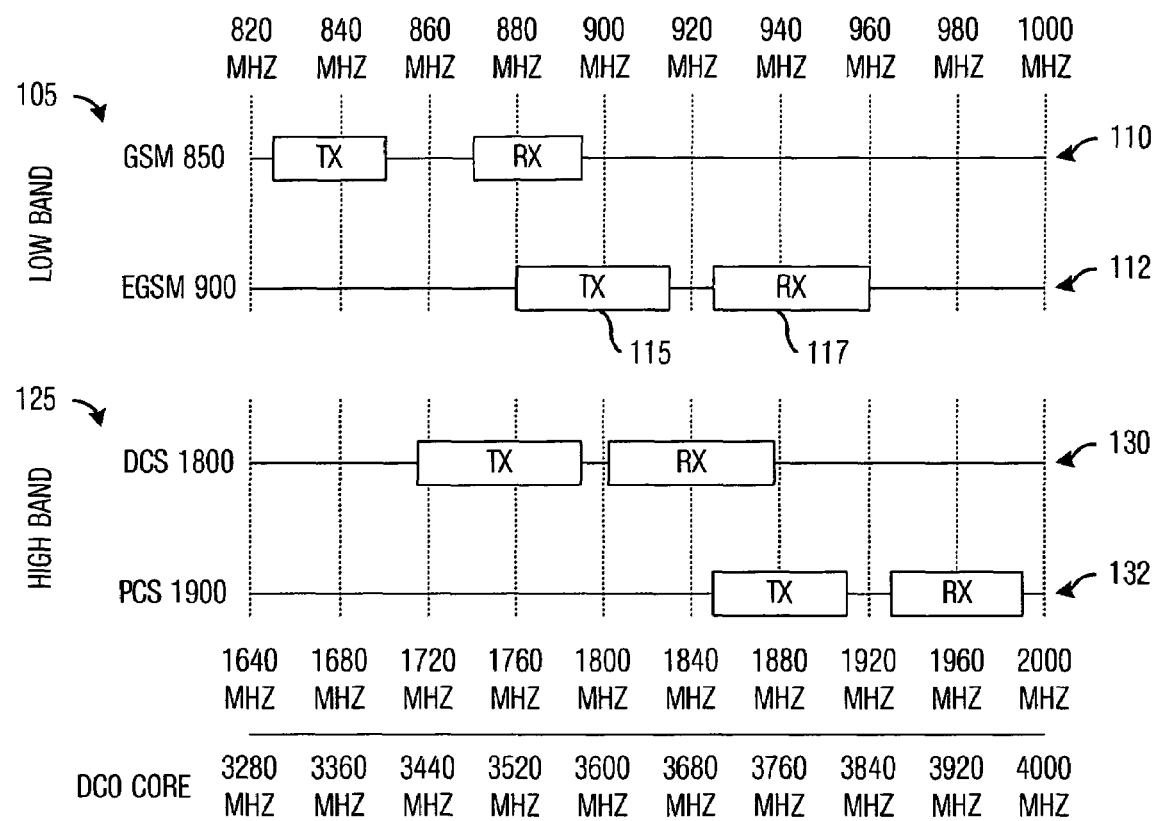
FIG. 1 is a frequency diagram of an exemplary multi-band cellular telephone.

With reference now to FIG. 1, there is shown a frequency diagram for an exemplary cellular telephone, wherein the cellular telephone is a multi-standard telephone. The frequency diagram shown in FIG. 1 illustrates various frequency ranges wherein the cellular telephone is required to operate. As shown in FIG. 1, the frequency diagram illustrates the frequency ranges in use for a multi-standard cellular telephone that is designed to be compatible with multiple GSM standards being used throughout the world. Note that while the frequency diagram illustrates different GSM standards, the use of specific frequency ranges and communications standards, namely, GSM, should not be construed as being limiting to the spirit of the present invention. For example, the present invention can be equally applicable to the various TDMA and CDMA communications standards in use throughout the world. Furthermore, the discussion of cellular telephones and cellular telephone communications standards should also not be construed as being limiting to the spirit of the present invention to only cellular telephones. The present invention can be applicable to other wired and wireless communications devices, such as tunable filters, wired local area networks (LANs), wireless LANs such as Wi-Fi, Global Positioning System (GPS), walkie-talkies, two-way radios, satellite telephones, optical communications devices, clock recovery circuits, wireless input devices (mouse, keyboard, etc.), wireless entertainment systems, and so forth.

The frequency diagram shows two frequency bands, a low band 105 (ranging from 820 MHz to 960 MHz) and a high band 125 (ranging from 1.7 GHz to 1.98 GHz). The low band 105 includes a GSM 850 band 110 and an Enhanced Global System for Mobile Communications (EGSM) 900 band 112 while the high band 125 includes a Digital Cellular System (DCS) 1800 band 130 and a Personal Communications Service (PCS) 1900 band 132. Within each band, there can be two frequency ranges that the cellular telephone should be able to tune to, a transmit range (TX) and a receive range (RX). For example, in the EGSM 900 band 112, a TX range 115 spans a frequency range of 880 MHz to 915 MHz and a RX range 117 spans a frequency range of 925 MHz to 960 MHz.

Due to the relatively wide frequency range of the low band 105 (136 MHz) and the high band 125 (280 MHz), it can be difficult for a single LC oscillator to span the entire frequency range. This may be due to constraints such as a low-power voltage supply, device characteristics of the varactor (limited $C_{max}/C_{min}$ ratio), parasitic capacitance of active and passive devices, additional parasitic capacitance due to dummy metal patterns in deep-submicron CMOS process technology, large oscillator signal swing decreasing an effective varactor $C_{max}/C_{min}$ ratio, and so forth. Difficulties in creating a single LC oscillator that is capable of tuning the entire range of both the low band 105 and the high band 125 are considered to be well understood by those of ordinary skill in the art of the present invention and will not be discussed further.

While the design of a single LC oscillator that is capable of tuning the entire range of a wide frequency range can be difficult, if not impossible, prior art techniques have proposed the creation of an LC oscillator that uses multiple oscillator cores and LC tanks. The use of the multiple oscillator cores and LC tanks can extend the tuning range of the LC oscillator so that the entire frequency range can be covered. The use of multiple oscillator cores and LC tanks have been proposed in documents entitled "A 3.6 GHz Double Cross-Coupled Multivibrator VCO with 1.6 GHz Tuning," published August 2001 and "RF-CMOS Oscillators with Switched Tuning," published 1998. Both documents are incorporated herein by reference. However, the use of multiple oscillator cores and LC tanks can greatly increase the size of the LC oscillator. An additional prior art technique proposes the use of a CMOS switch to short circuit a portion of an inductor to induce a shift in the oscillation frequency of the LC oscillator. The technique was described in a document entitled "Demonstration of a Switched Resonator Concept in a Dual-Band Monolithic CMOS LC-Tuned VCO," published 2001, which is herein incorporated by reference. Unfortunately, the CMOS switch can be a source of significant parasitic capacitance, which can present a problem as the operating frequencies increase due to the relatively small capacitance of the LC oscillator.

Figure 2A:
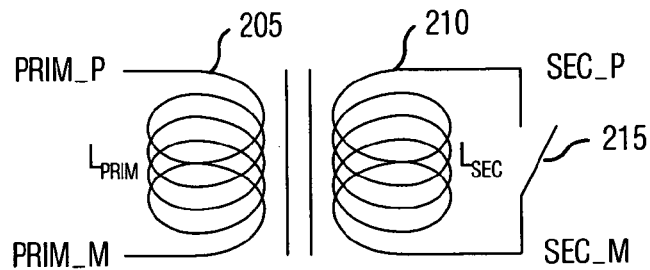
FIGS. 2a through 2c are diagrams of a variable transformer along with series and parallel equivalent circuits, according to a preferred embodiment of the present invention.
Figure 2B:
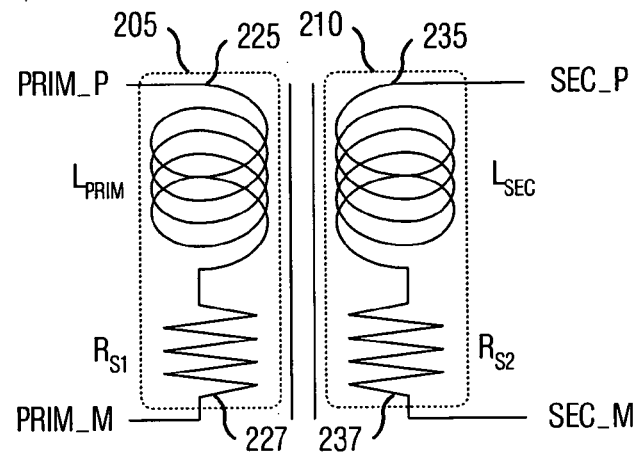
Figure 2C:
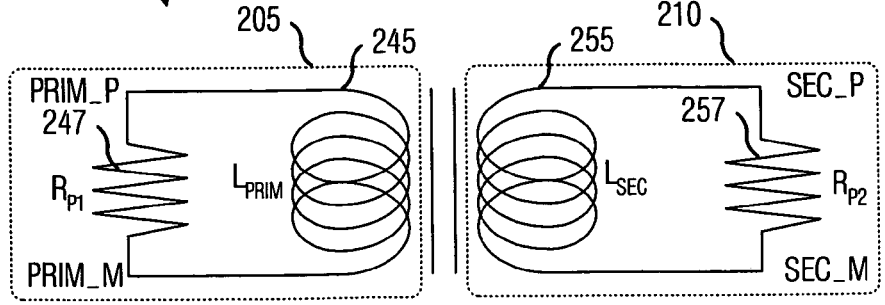

With reference now to FIGS. 2a through 2c, there are shown diagrams illustrating a variable transformer along with series and parallel equivalent circuits, according to a preferred embodiment of the present invention. The diagram shown in FIG. 2a illustrates a view of a variable transformer 200 wherein the variable transformer 200 comprises a primary inductor 205 with an inductance of $L_{PRIM}$ and a secondary inductor 210 with an inductance $L_{SEC}$. The primary inductor 205 having a pair of terminals, a primary_plus terminal (labeled "PRIM_P") and a primary_minus terminal (labeled "PRIM_M"), and the secondary inductor 210 having a pair of terminals, a secondary_plus terminal (labeled "SEC_P") and a secondary_minus terminal (labeled "SEC_M"). The secondary inductor 210 can be effectively switched on and off via a switch 215. According to a preferred embodiment of the present invention, the secondary inductor 210 is switched on when the switch 215 is in a closed state and the secondary inductor 210 is switched off when the switch 215 is in an open state. When the secondary inductor 210 is switched on, the inductance of the secondary inductor 210 can have an effect upon the first inductor 205, changing the effective inductance of the primary inductor 205, and thereby changing the tuning frequency of the LC oscillator. When the secondary inductor 210 is switched off, the secondary inductor 210 is effectively removed from the LC oscillator and the LC oscillator behaves as if it had only the primary inductor 205.

The effect of the secondary inductor 210 on the primary inductor 205 can be dependent upon factors that include the inductance of the secondary inductor 210, the coupling factor between the primary inductor 205 and the secondary inductor 210 (which can include the separation distance between the inductors, the material between the inductors, and so forth), and so on. Mutual inductance is considered to be well understood by those of ordinary skill in the art of the present invention and will not be discussed in further detail herein.

The diagram shown in FIG. 2b illustrates a serial equivalent circuit 220 of the variable inductor 200. In the serial equivalent circuit 220, the primary inductor 205 can be replaced by an equivalent first inductor 225 and a first serial resistor 227 while the secondary inductor 210 can be replaced by an equivalent second inductor 235 and a second serial resistor 237. The first serial resistor 227 and the second serial resistor 237 can be representative of parasitic resistances seen in the primary inductor 205 and the secondary inductor 210. Similarly, the diagram shown in FIG. 2c illustrates a parallel equivalent circuit 240 of the variable inductor 200, wherein the primary inductor 205 can be replaced by an equivalent first inductor 245 and a first parallel resistor 247 while the secondary inductor 210 can be replaced by an equivalent second inductor 255 and a second parallel resistor 257. Note that if the secondary inductor 210 has a high quality factor, then the resistance of the second parallel resistor 257 would be high. The transformed equivalent parallel resistance (the second parallel resistor 257, as seen at the primary inductor 205) would therefore also be high, resulting in a minimum overall impact on the primary inductor 205.

When active components are not attached to the terminals of the secondary inductor 210, SEC_P and SEC_M, to actively control a current flowing in the secondary inductor 210, then due to the fact that the secondary inductor 210 operates with current that is magnetically induced by the primary inductor 205, the overall effective magnetic flux seen by the primary inductor 205 is reduced when compared to the magnetic flux seen by the primary inductor 205 if it were operating alone (or if the secondary inductor 210 is off). Therefore, the effective inductance between the two terminals of the primary inductor 205, PRIM_P and PRIM_M, is decreased. Additionally, the effective quality factor of the primary inductor 205 can be reduced by the same percentage as that of the inductance of the primary inductor 205 if the secondary inductor 210 has a high quality factor. Therefore, when the variable inductor 200 is used in conjunction with an LC oscillator, the oscillation frequency of the LC oscillator would be higher when the switch 215 is closed and the oscillation frequency of the LC oscillator would be substantially unaffected when the switch 215 is open. Note that the variable transformer 200 can be optimized for the most sensitive frequency spot (where there is the highest quality (Q) requirement) corresponding to a frequency specified in the communications standard with the highest Q requirement. Other desired parameters can also be used to optimize the design of the variable transformer 200.

Figure 3A:
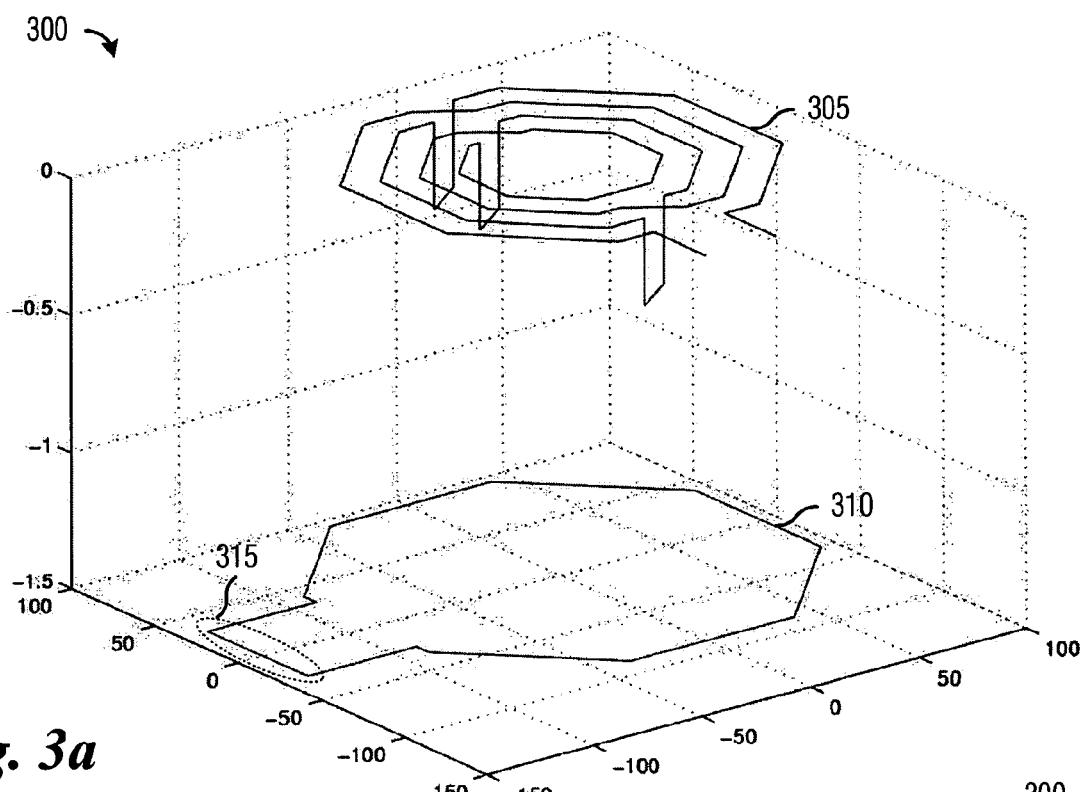
FIGS. 3a through 3c are diagram of several views of a variable inductor, wherein a single secondary inductor is used to change the inductance of the primary inductor, according to a preferred embodiment of the present invention.
Figure 3B:
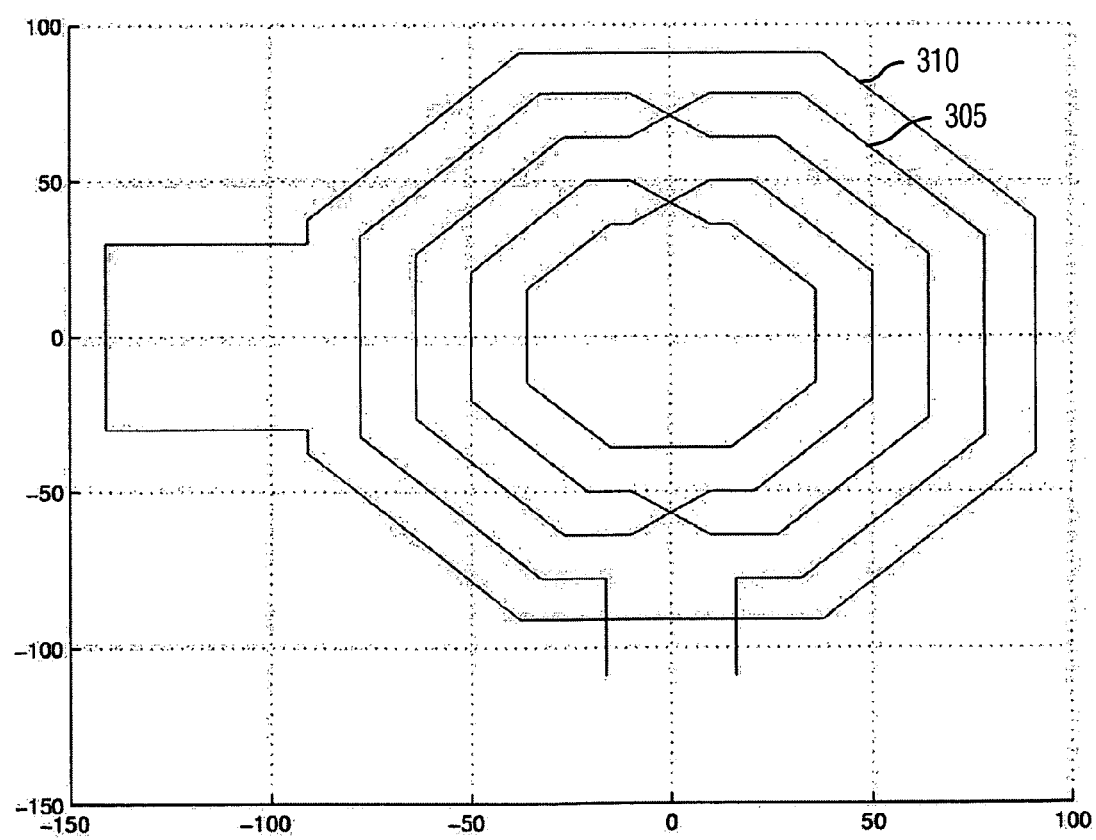
Figure 3C:
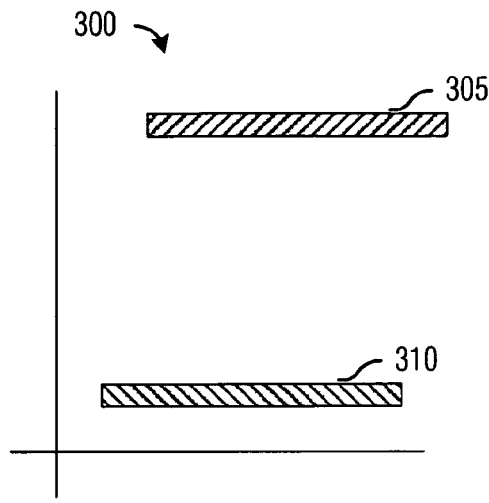

With reference now to FIGS. 3a through 3c, there are shown diagrams of differing views of a variable inductor 300, wherein a single secondary inductor is used to change the inductance of a primary inductor, according to a preferred embodiment of the present invention. Note that for clarity, the conductors forming the inductors are illustrated as thin lines connecting adjacent vertices of the inductors. The diagram shown in FIG. 3a illustrates an isometric view of the variable inductor 300 that may be formed on a semiconductor substrate. Again, for clarity, the semiconductor substrate is not shown, nor are any other components of an integrated circuit. A primary inductor 305 is shown formed above a secondary inductor 310. Note that since the primary inductor 305 is formed above the secondary inductor 310, there is little surface area penalty from the use of the secondary inductor 310. Additionally, in order to increase Q of the primary inductor 305, multiple layers above semiconductor substrate are electrically connected in parallel to reduce the parasitic serial resistance except at the crossovers that some of the layers are on top of the other (shown in FIG. 3a as portions extending below the surface of the primary inductor 305). Furthermore, although the secondary inductor 310 is shown as being formed below the primary inductor 305, the secondary inductor 310 may also be formed above the primary inductor 305, partially overlapping the primary inductor 305, outside (or inside) the primary inductor 305, or along side the primary inductor 305. In the last two cases (outside/inside and along side), the secondary inductor 310 may be formed on the same layer as the primary inductor 305.

As discussed previously, the effect of the secondary inductor 310 upon the primary inductor 305 can be a function of a separation between the primary inductor 305 and the secondary inductor 310 as well as the size and shape of the secondary inductor 310. The secondary inductor 310 is shown in FIG. 3a as being a closed loop. Not shown is a switch that can be used to break the loop in the secondary inductor 310. The switch can be located anywhere in the secondary inductor 310, such as along a portion highlighted in region 315. According to a preferred embodiment of the present invention, the switch can be opened or closed to affect the effective inductance of the primary inductor 305. For example, if the switch is closed, then the effective inductance of the primary inductor 305 can be reduced and if the switch is opened, then the effective inductance of the primary inductor 300 remains unaffected. Furthermore, the resistance of the switch itself can be controlled to limit the magnetically induced current flowing in the secondary inductor 310 to provide another degree of freedom that can be used for varying the effective inductance of the primary inductor 305.

The figure shown in FIG. 3b illustrates a top view of the variable inductor 300. The top view shows that the primary inductor 305 is smaller in area than the secondary inductor 310. Note however that due to the winding of the conductor in the primary inductor, the inductance of the primary inductor 305 may be larger than the inductance of the secondary inductor 305. The figure shown in FIG. 3c illustrates a side view of the variable inductor 300. The side view shows that the primary inductor 305 is clearly separated from the secondary inductor 310 by a thickness of an interlayer dielectric between the layers forming the two inductors. Note that the portion of the variable inductor 300 shown in FIG. 3c does not illustrate the portions of the electrical conductors making up the inductors that lay in layers other than the primary layers.

Figure 4A:
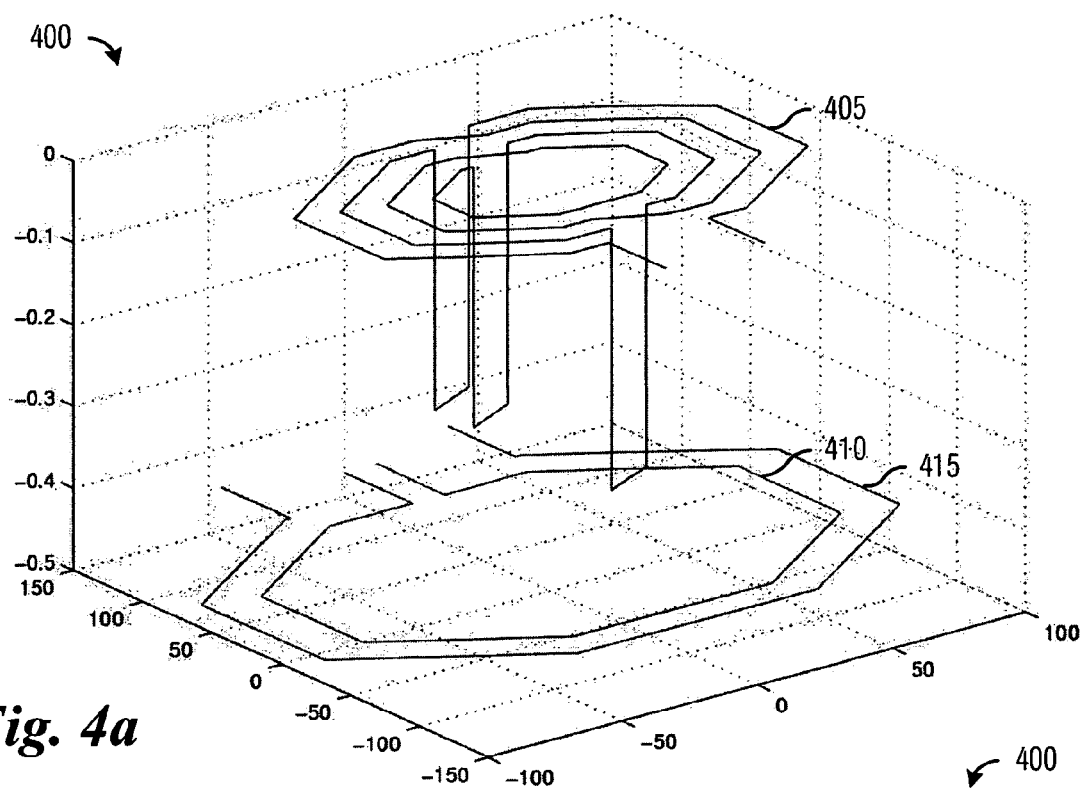
FIGS. 4a through 4c are diagram of several views of a variable inductor, wherein a pair of secondary inductors are used to change the inductance of the primary inductor, according to a preferred embodiment of the present invention.
Figure 4B:
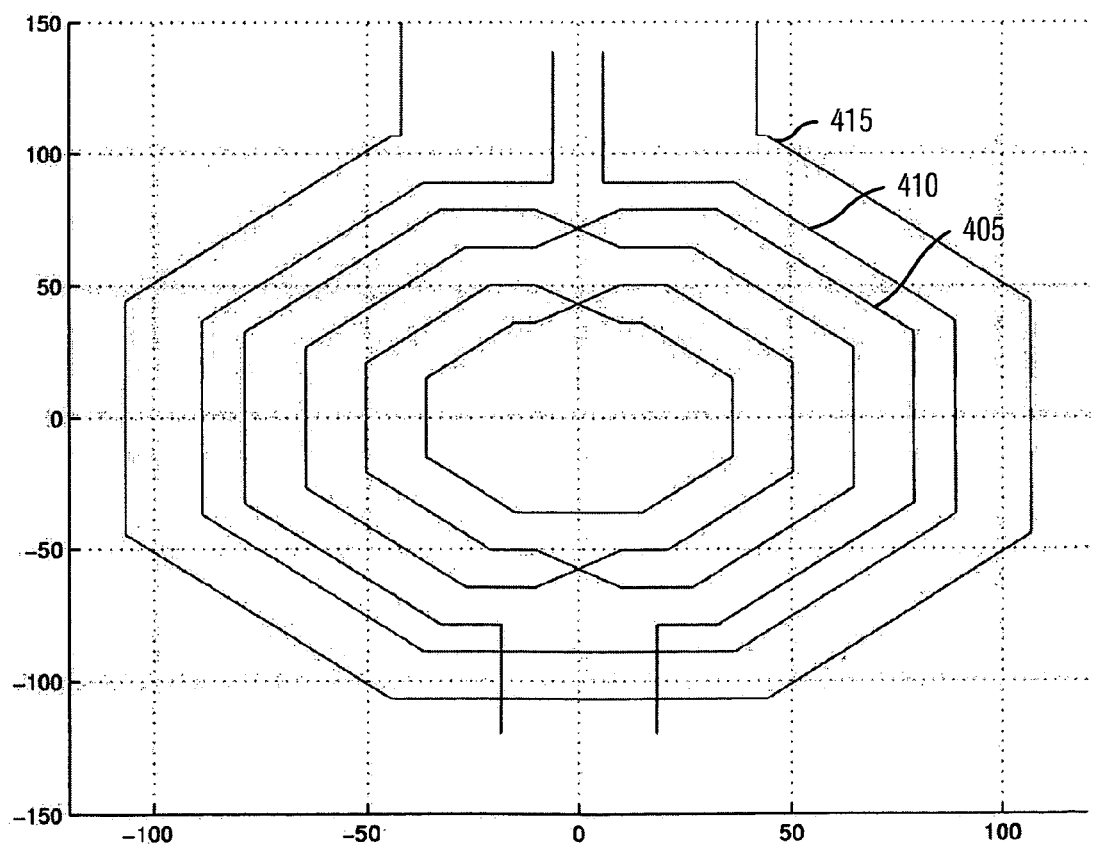
Figure 4C:
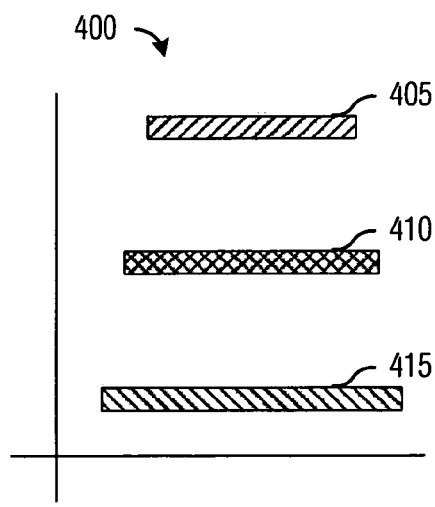

With reference now to FIGS. 4a through 4c, there are shown diagrams of differing views of a variable inductor 400, wherein a pair of secondary inductors are used to change the inductance of a primary inductor, according to a preferred embodiment of the present invention. The diagram shown in FIG. 4a illustrates an isometric view of the variable inductor 400 that may be formed on a semiconductor substrate. The variable inductor 400 comprises a primary inductor 405 and a pair of secondary inductors, a first secondary inductor 410 and a second secondary inductor 415. Once again, since the pair of secondary inductors are formed beneath the primary inductor 405, there is little surface area penalty incurred from the use of the secondary inductors. Note that the first secondary inductor 410 and the second secondary inductor 415 can be formed on different layers on the semiconductor substrate. Alternatively, with sizing restrictions in place to ensure that electrical contact is not made, the first secondary inductor 410 and the second secondary inductor 415 can be formed on a single layer. The present invention is not limited to the use of one secondary inductor or a pair of secondary inductors, therefore, the discussion of a single secondary inductor (as shown in FIGS. 3a through 3c) and of a pair of secondary inductors should not be construed as limiting the spirit of the present invention to the use of one or two secondary inductors. As stated earlier, the layers of secondary inductors 410 and 415 are not limited to be beneath the primary inductor layer.

Switches that can be used to control the state of the first secondary inductor 410 and the second secondary inductor 415 are not shown in FIG. 4a. As discussed above, the state of the switches can be used to affect the effective inductance of the primary inductor 405 and can be used individually or in conjunction with one another. For discussion purposes, let a switch controlling the state of the first secondary inductor 410 be referred to as 'switch one' while 'switch two' be a reference for a switch controlling the state of the second secondary inductor 415, then at a given instance of time, the state of switch one and switch two can be as follows: switch one OPEN and switch two OPEN—yielding an effective inductance at the primary inductor 405 substantially equal to the inductance of the primary inductor 405; switch one CLOSED and switch two OPEN—yielding an effective inductance at the primary inductor 405 that is a function of only the inductances of the first secondary inductor 410 and the primary inductor 405 as well as the coupling coefficient between the first secondary inductor 410 and the primary inductor 405; switch one OPEN and switch two CLOSED—yielding an effective inductance at the primary inductor 405 that is a function of only the inductances of the second secondary inductor 415 and the primary inductor 405 as well as the coupling coefficient between the second secondary inductor 415 and the primary inductor 405; switch one CLOSED and switch two CLOSED—yielding an effective inductance at the primary inductor 405 that is a function of the inductances of both the first secondary inductor 410 and the second secondary inductor 415 and the primary inductor 405 as well as the coupling coefficients among the first secondary inductor 410 and the second secondary inductor 415 and the primary inductor 405.

The figure shown in FIG. 4b illustrates a top view of the variable inductor 400. The top view shows that the first secondary inductor 410 is smaller physically than the second secondary inductor 415. Note however, it is possible to have a variable inductor with a second secondary inductor that is smaller physically than the first secondary inductor. Although shown in FIG. 4b to have similar shape, the shape of the first secondary inductor 410 can be different from the shape of the second secondary inductor 415. This is especially true when the secondary inductors are formed on different layers on the semiconductor substrate. However, when the secondary inductors are formed on a single layer of the semiconductor substrate, the shapes and sizes of the secondary inductors may be restricted due to constraints such as the secondary inductors must be electrically disjoint and that a majority of the secondary inductors must lie beneath the primary inductor 405. The figure shown in FIG. 4c illustrates a side view of the variable inductor 400. The side view shows that the primary inductor 405 is clearly separated from the first secondary inductor 410 and the second secondary inductor 415 and that the first secondary inductor 410 is closest to the primary inductor 405. Once again, note that the portion of the variable inductor 400 shown in FIG. 4c does not illustrate portions of the electrical conductors making up the inductors that lay in layers other than the primary layers.

Figure 5:
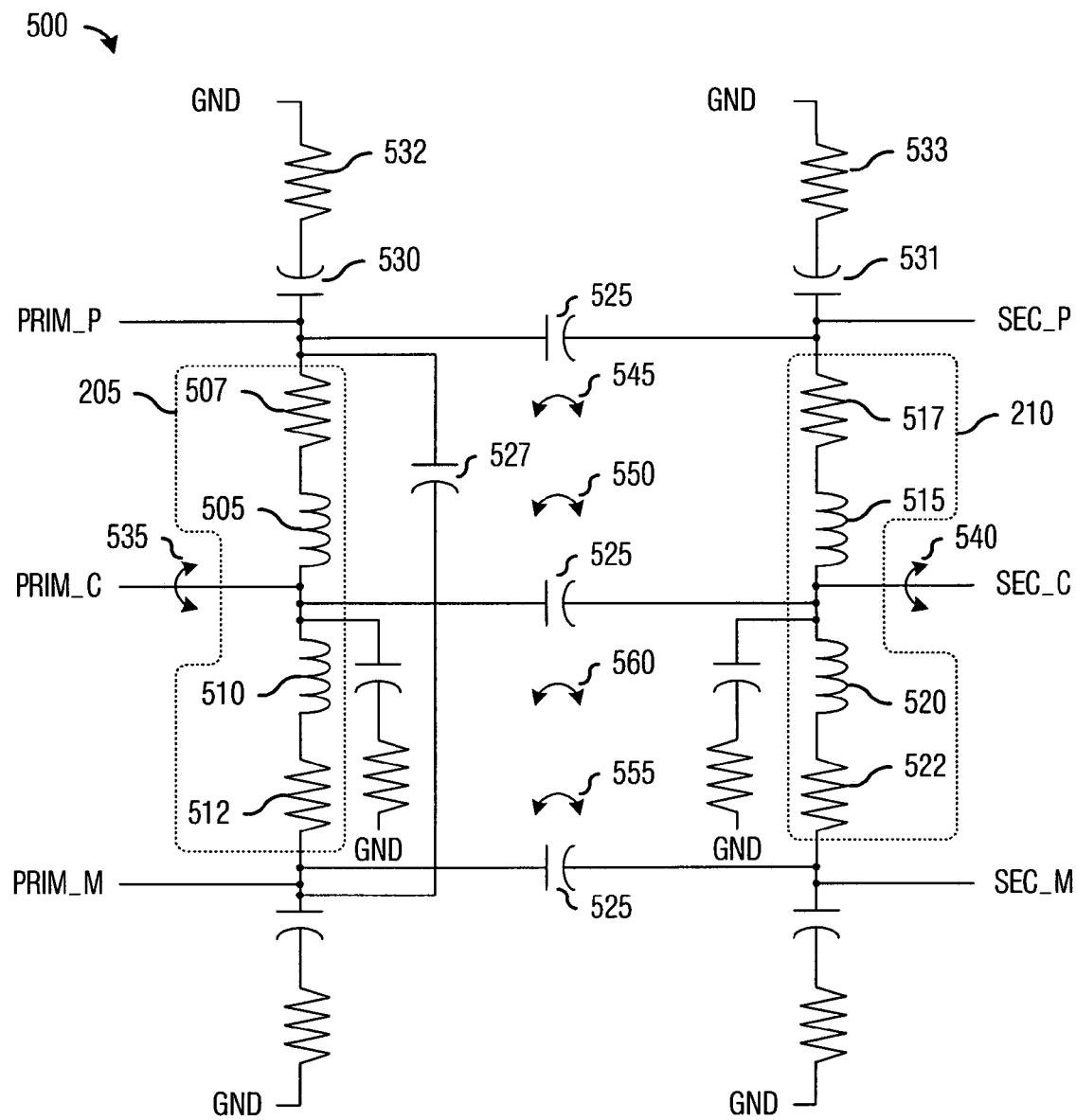
FIG. 5 is a diagram of a serial equivalent circuit of a variable inductor, according to a preferred embodiment of the present invention.

With reference now to FIG. 5, there is shown a diagram illustrating a serial equivalent circuit 500 of a variable inductor, according to a preferred embodiment of the present invention. Since the variable inductor can be implemented as a pair of transformers (primary inductor 205 and secondary inductor 210), the variable inductor can be shown as having four inductors (shown in FIG. 5 in their serial equivalent circuit form) to help understand the concept, especially when it is implemented with a differential circuit: a first primary inductor 505 and a second primary inductor 510 making up the primary inductor 205 and a first secondary inductor 515 and a second secondary inductor 520 making up the secondary inductor 210. As discussed previously, in the serial equivalent form, an inductor can be represented as an inductor with a parasitic resistance. The parasitic resistances for the four inductors are shown in FIG. 5 as resistors 507, 512, 517, and 522 respectively.

Parasitic capacitances can distributively exist between the conductors and are usually represented as lumped capacitors between terminals (the plus, center, and minus terminals of each inductor) of the primary inductor 205 and the secondary inductor 210 in the variable inductor such as capacitors 525 and 527. In addition to the parasitic resistances in the four inductors (resistors 507, 512, 517, and 522) and the parasitic capacitances between conductors (capacitors 525 and 527), parasitic capacitances and resistances also distributively exist between the conductors and an electrical AC ground, which are usually represented as lumped capacitors and resistors between each terminal of the primary inductor 205 and electrical AC ground as well as between each terminal of the secondary inductor 210 and electrical AC ground such as capacitors 530 and 531 and resistors 532 and 533 (note that in FIG. 5, capacitors and resistors representing parasitic capacitances and resistances are shown for each terminal of the primary inductor 205 and the secondary inductor 210 but are not referenced).

Coupling between the inductors (inductors 505, 510, 515, and 520) can be modeled as six (6) individual coupling factors. A first coupling factor 535 models a coupling between the inductor 505 and the inductor 510 (both of the primary inductor 205), while a second coupling factor 540 models a coupling between the inductor 515 and the inductor 520 (both of the secondary inductor 210). The remaining four coupling factors model coupling between the primary inductor 205 and the secondary inductor 210. A third coupling factor 545 models a coupling between the inductor 505 and the inductor 515, a fourth coupling factor 550 models a coupling between the inductor 505 and the inductor 520, a fifth coupling factor 555 models a coupling between the inductor 510 and the inductor 520, and a sixth coupling factor 560 models a coupling between the inductor 510 and the inductor 515.

Figure 6B:
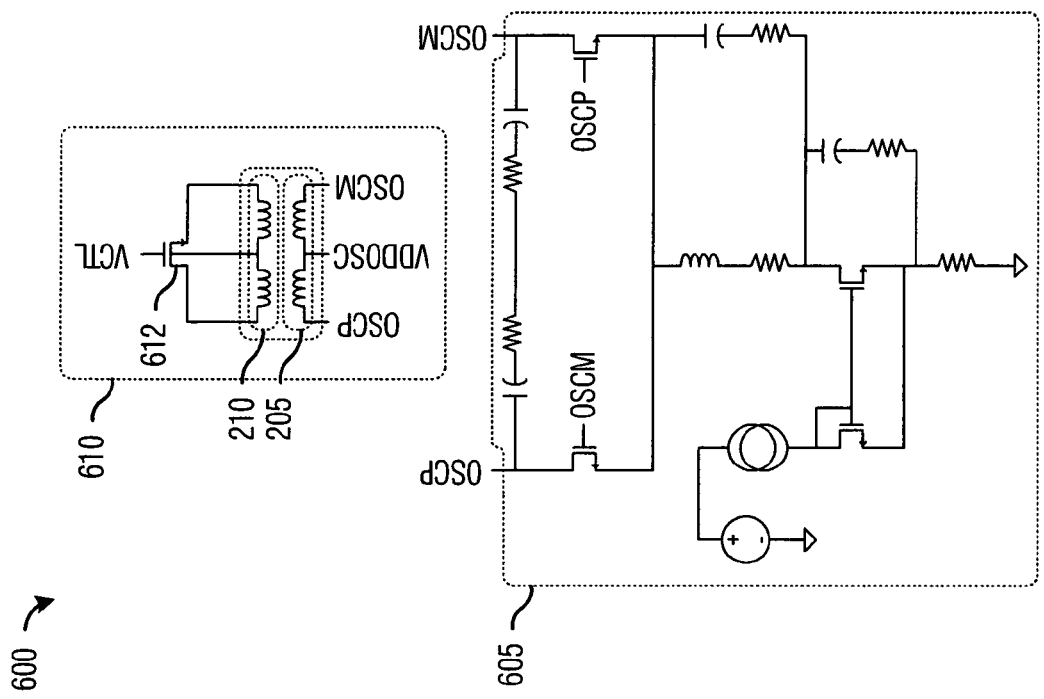
FIGS. 6a and 6b are diagrams of a circuit comprising a VCO and a variable inductor, wherein the variable inductor can help to increase the frequency tuning range of the VCO, according to a preferred embodiment of the present invention.
Figure 6A:
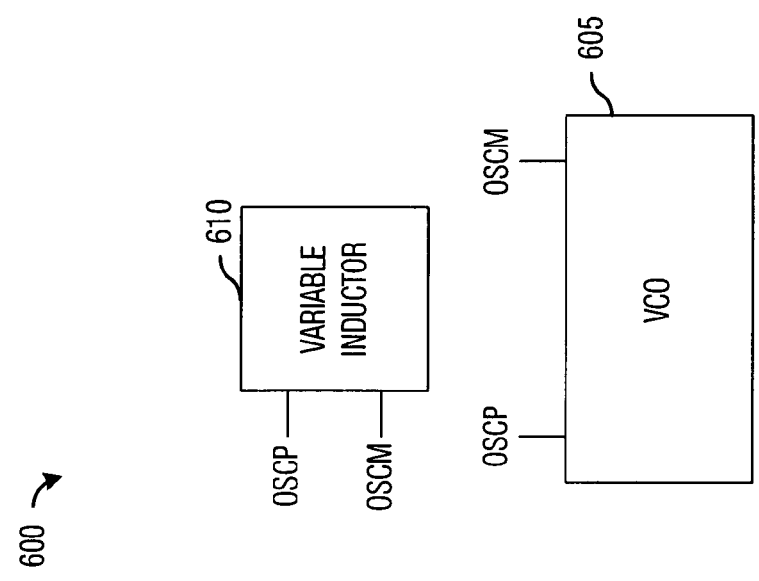

With reference now to FIGS. 6a and 6b, there are shown diagrams illustrating views of a circuit 600 comprising a voltage-controlled oscillator (VCO) 605 and a variable inductor 610, wherein the variable inductor 610 can help to increase the tuning range of the VCO 605, according to a preferred embodiment of the present invention. The diagram shown in FIG. 6a illustrates a high-level functional view of the circuit 600. The circuit 600, shown in FIGS. 6a and 6b, is a LC oscillator and makes use of the variable inductor 610 to increase its frequency tuning range without having to use multiple oscillator cores and LC tanks. The VCO 605 can be coupled to the variable inductor 610 by a pair of signals, oscillator plus "OSCP" and oscillator minus "OSCM." The inductance seen across the OSCP and OSCM signals can have an effect upon the frequency of the output of the VCO 605.

The diagram shown in FIG. 6b illustrates a detailed schematic of a particular implementation of the circuit 600. The detailed schematic of the VCO 605 shows a typical VCO and will not be described herein. The detailed schematic of the variable inductor 620 illustrates the primary inductor 205 and the secondary inductor 210 shown as a four inductor model, similar to the serial model shown in FIG. 5 without parasitic resistances, parasitic capacitances, and coupling factors to help maintain simplicity. A transistor 612, preferably a N-type metal oxide semiconductor (NMOS) transistor although a P-type metal oxide semiconductor (PMOS) transistor can also be used, can be used to control the state of the secondary inductor 210. Additionally, a bi-polar junction transistor (BJT) can also be used to control the state of the secondary inductor 210 by functioning as a switch. The transistor 612, operating as a switch, can be controlled by a signal at its gate terminal, displayed in FIG. 6b as signal "VCTL."

The oscillator plus "OSCP" and oscillator minus "OSCM" signals from the VCO 605 can be coupled to the primary plus "PRIM_P" and the primary minus "PRIM_M" terminals of the primary inductor 205. Additionally, the center terminal "PRIM_C" of the primary inductor 205 can be coupled to a voltage supply providing the current to operate the VCO 605.

Using engineering design tools, the circuit 600 was simulated using the model of the variable inductor 610 shown in FIG. 5 with the following parameters: the first primary inductor 505 was 0.5988 nH, the second primary inductor 510 was 0.5988 nH, the first secondary inductor 515 was 0.2389 nH, the second secondary inductor 520 was 0.2389 nH, the first through sixth coupling factors (coupling factors 535, 540, 545, 550, 555, and 560) were 0.618371, −0.320204, −0.291226, −0.304592, −0.274701, and −0.122267 respectively, the parasitic series resistances are 1.17125 ohms for resistors 507 and 512 and 2 ohms for resistors 517 and 522, the parasitic capacitance (such as capacitor 525) between the primary inductor 205 and the secondary inductor 210 was 56.892 pf each. Simulations show that with the transistor 612 open, the circuit 600 produced an oscillating frequency of 3.371 GHz and an oscillating frequency of 3.787 GHz when the transistor 612 is closed. The VCO 605, alone, provides a frequency tuning range of approximately 800 MHz. However, when used in conjunction with the variable inductor 610, the frequency tuning range increases to approximately 1200 MHz, or a 50 percent increase.

According to a preferred embodiment of the present invention, the frequency tuning range can be further increased by connecting the center terminal "SEC_C" (not labeled in FIG. 6b) of the secondary inductor 210 to electrical power or ground (i.e. an AC ground) with a large resistor and through redesigning the second inductor 210. Simulation results show that the phase noise of the circuit 600 is approximately 9 dB below that of the VCO 605 due to the lack of optimization of the second inductor 210.

Although the diagram in FIG. 6b illustrates a single secondary inductor 210, multiple inductors can be used in place of the single inductor. The multiple inductors can be used separately from each other to alter the effective inductance of the primary inductor 205 or they can be used in combination with each other to provide a greater change on the effective inductance of the primary inductor 205.

With reference now to FIGS. 7a and 7b, there are shown diagrams illustrating views of a circuit 700 comprising a voltage-controlled oscillator (VCO) 605 and a variable inductor 610, wherein the variable inductor 610 and active components coupled to the variable inductor 610 can help to further increase the tuning range of the VCO 605, according to a preferred embodiment of the present invention. When active devices are not coupled to the secondary inductor 210, the variable inductor 610 can change the oscillating frequency of the VCO 605 by decreasing the effective inductance of the primary inductor 205, this results in an increase in the oscillating frequency. However, when active devices are coupled to the secondary inductor 210, it can be possible to cause an increase in the effective inductance of the primary inductor 205, resulting in a decrease in the oscillating frequency.

The diagram shown in FIG. 7a illustrates a high-level functional view of the circuit 700. The circuit 700 includes the VCO 605 and the variable inductor 610 coupled together via a pair of signals, "OSCP" and "OSCM," similar to the circuit 600 (FIG. 6a). However, two transistors 705, preferably NMOS transistors although PMOS transistors can also be used, also couple the VCO 605 to the variable inductor 610. Again, BJT transistors can be used in place of the field-effect transistors (NMOS or PMOS transistors). The two transistors 705 are controlled by the "OSCP" and "OSCM" signals produced by the VCO 605. The transistor that is controlled by the "OSCP" signal can have a source/drain terminal coupled to the plus terminal "SEC_P" of the secondary inductor 210 while the transistor that is controlled by the "OSCM" signal can have a source/drain terminal coupled to the minus terminal "SEC_M" of the secondary inductor 210.

The presence of the active components (the pair of transistors 705) can function as positive feedback switches to force current in the secondary inductor 210 to flow in an opposite direction to the current flowing in the primary inductor 205. This effect can result in a decrease in the effective inductance of the primary inductor 205 and result in an increase in the oscillating frequency of the circuit 700. Alternatively, the current in the secondary inductor 210 can be forced to flow in the same direction as the current flowing in the primary inductor 205 to further enhance the effective inductance of the primary inductor 205 and possibly result in an increase in the quality (Q) factor and a decrease in the oscillating frequency. Note that different arrangements of active components can be used in place of the pair of transistors 705 to yield similar (or enhanced) effects. Note that the inclusion of the pair of transistors 705 will incur a very small area penalty due to the small size requirements of the pair of transistors 705.

The diagram shown in FIG. 7b illustrates a detailed schematic of a particular implementation of the circuit 700. The schematic of the VCO 605 is similar to the schematic of the VCO 605 shown in FIG. 6b. The schematic of the variable inductor 610 shows that the primary inductor 205 is also similar to the configuration of the primary inductor 205 shown in FIG. 6b. However, with the secondary inductor 210, rather than having a transistor (transistor 612 (FIG. 6b)) controlling the state of the secondary inductor 210, the plus terminal and the minus terminal of the secondary inductor 210 are coupled to the pair of transistors 705 while the center terminal can be coupled to electrical ground, a voltage supply or to the center terminal of the primary inductor 205. As discussed above, the single secondary inductor 205 can be replaced with multiple inductors, with each inductor being coupled to the VCO 605 by a pair of transistors.

According to yet another preferred embodiment of the present invention, it can be possible to combine the design of the secondary inductor 205 illustrated in FIG. 6b with that shown in FIG. 7b. For example, in a secondary inductor with two inductors, a first inductor can be configured as shown in FIG. 6b while a second inductor can be configured as shown in FIG. 7b.

According to yet another preferred embodiment of the present invention, configurations in FIG. 6b and FIG. 7b can be further combined by adding a switch 612 between SEC_P and SEC_M of the secondary inductor in FIG. 7b.

Figure 8:
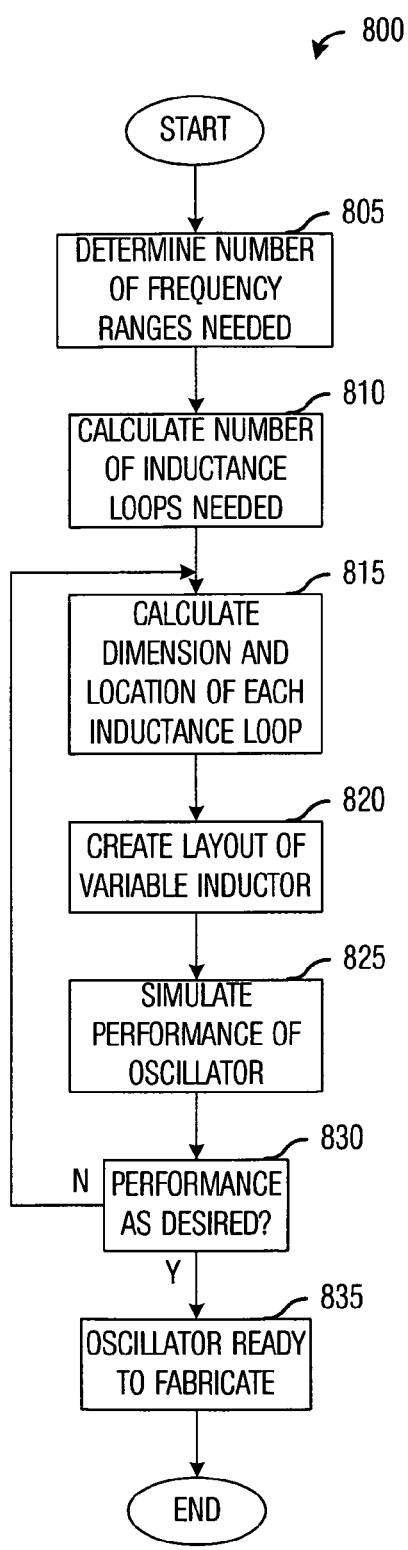
FIG. 8 is a flow diagram of a sequence of events for designing a RF/microwave oscillator with an extended frequency tuning range, according to a preferred embodiment of the present invention.

With reference now to FIG. 8, there is shown a flow diagram illustrating a sequence of events 800 for designing a RF/microwave oscillator with an extended frequency tuning range, according to a preferred embodiment of the present invention. The sequence of events 800 illustrates an exemplary design for a RF/microwave oscillator with an extended frequency tuning range that makes use of a variable inductor. The sequence of events 800 can begin with a specification of a number of frequency ranges needed (block 805). The number of frequency ranges needed can be dependent upon factors such as the width of the overall frequency range that needs to be spanned, the frequency tuning range of the oscillator that will be used in the design, the desired quality (Q) of the inductor and LC tank, and so forth. After the number of frequency ranges have been determined, then a number of inductance loops needed is calculated (block 810). The number of inductance loops needed can be dependent upon a design selected for the variable inductor. For example, if simple inductance loops using switches to regulate the state of the loops is used, then the number of inductance loops may be equal to the number of frequency ranges. A more sophisticated inductance loop design, such as one using active components to change the effective inductance in several ways or if inductance loops can be used in conjunction with one another, then the number of inductance loops can be less than the number of frequency ranges.

Then, based upon the frequency ranges, the number of inductance loops, the design of the oscillator, and so on, the characteristics of the inductance loops can be calculated (block 815). The characteristics of the inductance loops can include but are not limited to the size of the inductance loops, the shape of the inductance loops, the location of the inductance loops, the separation of the inductance loops in relation to a primary inductor, and so forth. Additionally, the ON resistance of the switches used to regulate the state of the loops, wherein if a FET is used as a switch, the ON resistance can be calculated based on gate width and gate length, while if a BJT is used as a switch, the ON resistance can be calculated based on silicon area of the collector and the emitter of the BJT. With the characteristics of the inductance loops determined, the variable inductor can be laid out along with the remainder of the oscillator (block 820). Then, using engineering design tools, it can be possible to simulate the performance of the oscillator (block 825). The simulation of the oscillator can be used to verify performance before the expensive fabrication of the oscillator takes place. If the simulation shows that the oscillator performs as desired (block 830), then the oscillator is ready for fabrication (block 835). If the simulation shows that the oscillator does not perform as desired, then the design of the variable inductor may need to be revised.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
a semiconductor substrate;
a first inductor disposed over the semiconductor substrate and comprising a first terminal and a second terminal, wherein the first inductor provides an effective inductive load to circuitry coupled to the first and second terminals of the first inductor; and
a plurality of second inductors disposed on the semiconductor substrate and comprising a first terminal and a second terminal, the plurality of second inductors adjacent to the first inductor so that the plurality of second inductors are magnetically coupled to the first inductor, wherein each of said plurality of second inductors has a corresponding variable impedance element coupled to the first and second terminal of each said second inductor, and wherein each corresponding variable impedance element comprises a transistor.

2. The integrated circuit of claim 1, wherein the transistor of each variable impedance element comprising a first terminal coupled to the first terminal of the corresponding second inductor, a second terminal coupled to the second terminal of the corresponding second inductor, and a control terminal, and wherein a control signal line is coupled to the control terminal of the transistor, wherein the control signal line affects the effective inductive load provided to the circuitry coupled to the first and second terminals of the first inductor.

3. The integrated circuit of claim 1, wherein the corresponding second inductor is formed above, below, inside, outside or along side the first inductor.

4. An oscillator comprising:
a voltage controlled oscillator (VCO), the VCO is configured to generate an output signal at a frequency that is dependent upon a magnitude of an input voltage signal and an effective inductance of a, inductive load;
a variable inductor coupled to the VCO, the variable inductor comprising a primary inductor coupled to the VCO, the primary inductor to produce a magnetic field based upon a current flowing through the primary inductor, resulting in an inductive load for the VCO; and
a secondary inductor magnetically coupled to the primary inductor, the secondary inductor to affect the magnitude of the effective inductance of the primary inductor, wherein the secondary inductor comprises:
a conductive element, wherein the conductive element having a first end and a second end; and
a switch having a first terminal coupled to the first end of the conductive element and a second terminal coupled to the second end of the conductive element, the switch control the state of the secondary inductor.

5. The oscillator of claim 4, wherein the inductive load is the primary inductor.

6. The oscillator of claim 4, wherein the switch is a transistor, and wherein the transistor is a field-effect transistor (FET), wherein the first terminal is a first drain/source terminal of the FET and the second terminal is a second drain/source terminal of the FET.

7. The oscillator of claim 4, wherein the switch is a transistor, and wherein the transistor is a bi-polar junction transistor (BJT), wherein the first terminal is a first collector/emitter terminal of the BJT and the second terminal is a second collector/emitter terminal of the BJT.

8. The oscillator of claim 4, wherein the secondary inductor is either opened or closed depending upon a state of the switch.

9. The oscillator of claim 4, wherein the secondary inductor comprises a plurality of conductive elements, wherein each conductive element has a first end and a second end, and wherein each conductive element is coupled to a switch.

10. The oscillator of claim 4, wherein the secondary inductor comprises two terminals, the oscillator further comprising a pair of active components, the first active component coupled in between the VCO and a first terminal of the secondary inductor and the second active component coupled in between the VCO and a second terminal of the secondary inductor.

11. The oscillator of claim 10, wherein the pair of active components are transistors, and wherein the transistors are field-effect transistors (FET), wherein each FET has a gate terminal, and wherein a gate terminal of the first FET is coupled to a first control signal provided by the VCO and a gate terminal of the second FET is coupled to a second control signal provided by the VCO.

12. The oscillator of claim 10, wherein the pair of active components are transistors, and wherein the transistors are bi-polar junction transistors (BJT), wherein each BJT having a base terminal, and wherein a base terminal of the first BJT is coupled to a first control signal provided by the VCO and a base terminal of the second BJT is coupled to a second control signal provided by the VCO.

* * * * *